(12) United States Patent
Jang et al.

(10) Patent No.: US 12,451,414 B2
(45) Date of Patent: Oct. 21, 2025

(54) SEMICONDUCTOR PACKAGE

(71) Applicant: Samsung Electronics Co., Ltd.,
Suwon-si (KR)

(72) Inventors: Doyoung Jang, Suwon-si (KR); Eunsu Lee, Asan-si (KR)

(73) Assignee: Samsung Electronics Co., Ltd.,
Suwon-si (KR)

( * ) Notice: Subject to any disclaimer, the term of this patent is extended or adjusted under 35 U.S.C. 154(b) by 489 days.

(21) Appl. No.: 18/050,705

(22) Filed: Oct. 28, 2022

(65) Prior Publication Data

US 2023/0139141 A1 May 4, 2023

(30) Foreign Application Priority Data

Nov. 1, 2021 (KR) ........................ 10-2021-0148263

(51) Int. Cl.
*H01L 23/498* (2006.01)
*H01L 23/00* (2006.01)
*H01L 25/10* (2006.01)

(52) U.S. Cl.
CPC .. *H01L 23/49816* (2013.01); *H01L 23/49833* (2013.01); *H01L 23/49838* (2013.01);
(Continued)

(58) Field of Classification Search
CPC ......... H01L 23/49816; H01L 23/49833; H01L 23/49838
See application file for complete search history.

(56) References Cited

U.S. PATENT DOCUMENTS 8,330,277 B2 * 12/2012 Machida ............... H01L 25/105
257/E21.511
8,901,726 B2  12/2014 Lin et al.
(Continued)

FOREIGN PATENT DOCUMENTS

KR         101562709 B1   10/2015
KR   10-2016-0012589 A    2/2016
(Continued)

OTHER PUBLICATIONS

Office Action in Korean Appln. No. 10-2021-0148263, mailed on Aug. 8, 2025, 16 pages (with English translation).

*Primary Examiner* — Errol V Fernandes
(74) *Attorney, Agent, or Firm* — Fish & Richardson P.C.

(57) ABSTRACT

A semiconductor package includes a first package substrate, a semiconductor chip on the first package substrate, a second package substrate over the first package substrate and the semiconductor chip, and a plurality of core structures and a plurality of solder balls. The core structures and the solder balls are between the first package substrate and the second package substrate, a first portion of the plurality of core structures and the plurality of solder balls are apart from the semiconductor chip in a first dimension direction, and a second portion of the plurality of core structures and the plurality of solder balls are apart from the semiconductor chip in a second dimension direction that is different than the first dimension direction. The semiconductor package includes a plurality of strip guides between the semiconductor chip and the plurality of core structures, and in parallel with a periphery of the semiconductor chip.

20 Claims, 15 Drawing Sheets

(52) U.S. Cl.
CPC ........ *H01L 23/49866* (2013.01); *H01L 24/16* (2013.01); *H01L 24/32* (2013.01); *H01L 24/73* (2013.01); *H01L 25/105* (2013.01); *H01L 2224/16227* (2013.01); *H01L 2224/32225* (2013.01); *H01L 2224/73204* (2013.01); *H01L 2225/1023* (2013.01); *H01L 2225/1041* (2013.01); *H01L 2225/1058* (2013.01); *H01L 2924/1434* (2013.01); *H01L 2924/15331* (2013.01)

(56) References Cited

U.S. PATENT DOCUMENTS

| | | | |
|---|---|---|---|
| 9,018,041 B2 * | 4/2015 | Youn | H01L 24/03 |
| | | | 438/109 |
| 9,349,713 B2 | 5/2016 | Kim et al. | |
| 9,508,674 B2 | 11/2016 | Pan et al. | |
| 9,659,891 B2 * | 5/2017 | Hwang | H01L 23/147 |
| 9,818,734 B2 * | 11/2017 | Lin | H01L 23/3121 |
| 9,859,200 B2 * | 1/2018 | Park | H01L 23/3142 |
| 10,050,020 B2 | 8/2018 | Shi et al. | |
| 10,361,177 B2 | 7/2019 | Kim et al. | |
| 11,450,614 B2 | 9/2022 | Kim et al. | |
| 2012/0193783 A1 * | 8/2012 | Hong | H01L 23/49811 |
| | | | 257/737 |
| 2018/0090471 A1 | 3/2018 | Chiu et al. | |

FOREIGN PATENT DOCUMENTS

| | | |
|---|---|---|
| KR | 10-2017-0116642 A | 10/2017 |
| KR | 10-2019-0025097 A | 3/2019 |
| KR | 10-2021-0126228 A | 10/2021 |

* cited by examiner

SEMICONDUCTOR PACKAGE

CROSS-REFERENCE TO RELATED APPLICATION

This U.S. non-provisional patent application claims priority under 35 U.S.C. § 119 to Korean Patent Application No. 10-2021-0148263, filed on Nov. 1, 2021 in the Korean Intellectual Property Office, the disclosure of which is incorporated by reference herein in its entirety.

BACKGROUND

The inventive concepts relate to a semiconductor package, and for example, to a semiconductor package of a package on package type.

It may be desirable to increase a storage capacity of a semiconductor chip and at the same time, that a semiconductor package including the semiconductor chip is thin and light. In addition, there is a trend of conducting research into including semiconductor chips having various functions in a semiconductor package, and research into driving the semiconductor chips faster. In response to the trend, research has been conducted into a semiconductor package of a package on package type, which has a structure where an upper semiconductor package is mounted on a lower semiconductor package.

SUMMARY

The inventive concepts may provide a semiconductor package having structural reliability and electrical connection reliability.

According to an aspect of the inventive concepts, a semiconductor package includes a first package substrate, a semiconductor chip on the first package substrate, a second package substrate over the first package substrate and the semiconductor chip, and a plurality of core structures and a plurality of solder balls. The plurality of core structures and the plurality of solder balls are between the first package substrate and the second package substrate, a first portion of the plurality of core structures and the plurality of solder balls are apart from the semiconductor chip in a first dimension direction, and a second portion of the plurality of core structures and the plurality of solder balls are apart from the semiconductor chip in a second dimension direction that is different than the first dimension direction. The semiconductor package includes a plurality of strip guides between the semiconductor chip and the plurality of core structures, and the plurality of strip guides are in parallel with a periphery of the semiconductor chip.

According to another aspect of the inventive concepts, a semiconductor package includes a lower package and an upper package. The lower package includes a first package substrate, a first semiconductor chip on the first package substrate, a second package substrate arranged over the first package substrate and the first semiconductor chip, and a plurality of core structures and a plurality of solder balls. The plurality of core structures and the plurality of solder balls are between the first package substrate and the second package substrate, a first portion of the plurality of core structures and the plurality of solder balls are apart from the semiconductor chip in a first dimension direction, and a second portion of the plurality of core structures and the plurality of solder balls are apart from the semiconductor chip in a second dimension direction that is different than the first dimension direction. The upper package includes a plurality of strip guides arranged between the first semiconductor chip and the plurality of solder balls, and the plurality of strip guides are between the first semiconductor chip and the plurality of core structures. The upper package includes a third package substrate, a second semiconductor chip on the third package substrate, and a package connection member between the lower package and the upper package, and the package connection member electrically connects the lower package to the upper package.

According to another aspect of the inventive concepts, a semiconductor package includes a first package substrate, a semiconductor chip on the first package substrate, a second package substrate over the first package substrate and the semiconductor chip, a molding layer between the first package substrate and the second package substrate surrounding the semiconductor chip, and a plurality of core structures penetrating the molding layer. A first portion of the plurality of core structures are apart from the semiconductor chip in a first dimension direction, a second portion of the plurality of core structures are apart from the semiconductor chip in a second dimension direction that is different than the first dimension direction, and the plurality of core structures are in symmetrical rows with respect to a central portion of the semiconductor chip. The semiconductor package includes a plurality of solder balls penetrating the molding layer, and connect the first package substrate to the second package substrate, and a plurality of strip guides including a plurality of first sub-strip guides and a plurality of second sub-strip guides. The plurality of first sub-strip guides are between two opposite edges of the first package substrate and two opposite edges of the semiconductor chip corresponding to the two opposite edges of the first package substrate, and in parallel with the two opposite edges of the first package substrate, and a cross-section of the plurality of first sub-strip guides, which is vertical to an extension direction of the plurality of first sub-strip guides, has a rectangular shape in which a vertical height of the cross-section of the plurality of first sub-strip guides is greater than a horizontal width of the cross-section of the plurality of first sub-strip guides. The plurality of second sub-strip guides are between two other opposite edges of the first package substrate and two other opposite edges of the semiconductor chip, and extend in parallel with the two other opposite edges of the first package substrate, and a cross-section of the plurality of second sub-strip guides, which is vertical to an extension direction of the plurality of second sub-strip guides, has a rectangular shape in which a vertical height of the cross-section of the plurality of second sub-strip guides is greater than a horizontal width of the cross-section of the plurality of second sub-strip guides.

BRIEF DESCRIPTION OF THE DRAWINGS

Embodiments of the inventive concept will be more clearly understood from the following detailed description taken in conjunction with the accompanying drawings in which.

DETAILED DESCRIPTION

Figure 1A:
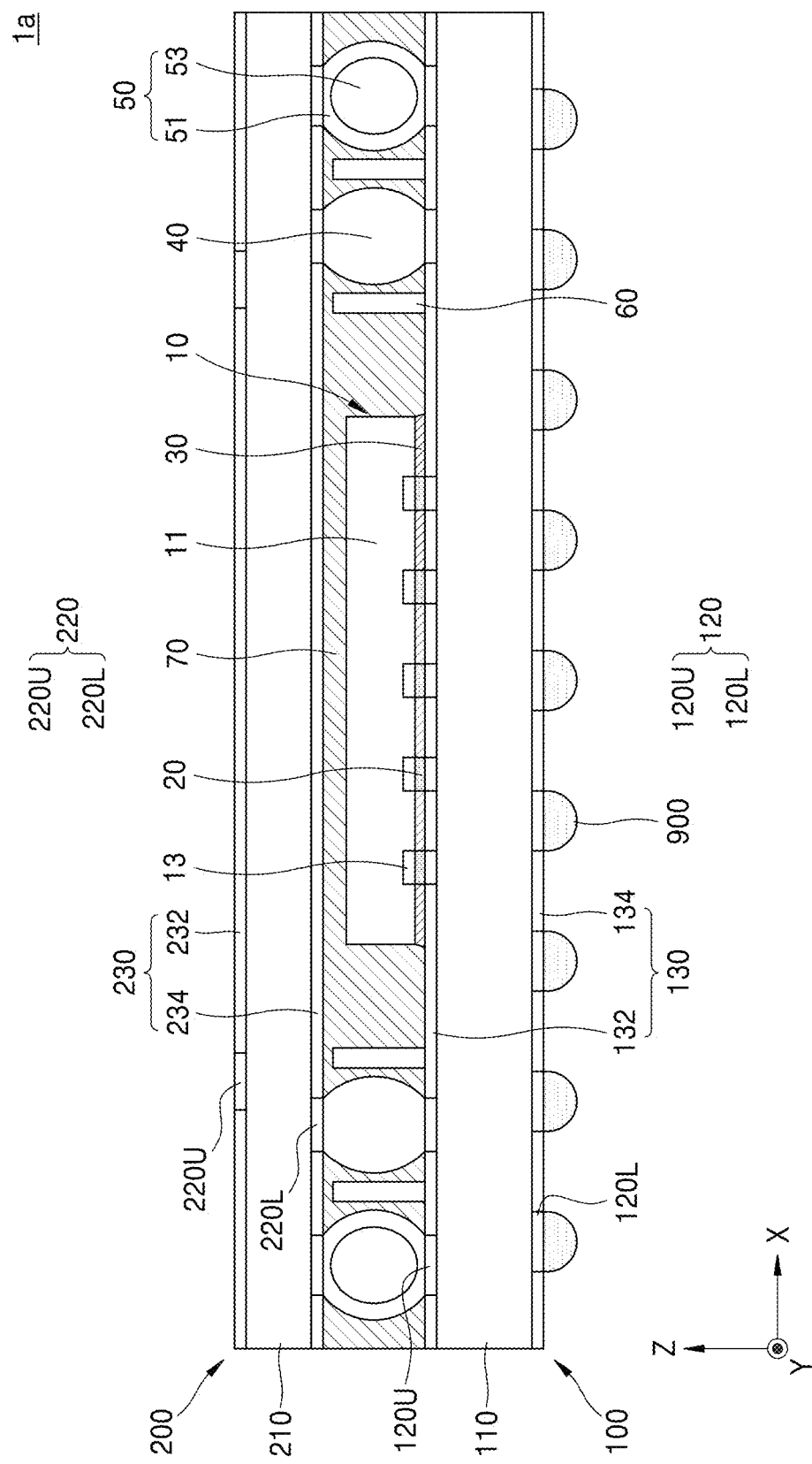
FIGS. 1A, 1B and 1C are cross-sectional views of semiconductor packages according to some example embodiments.

Hereinafter, example embodiments of the inventive concepts are described in detail with reference to the accompanying drawings. Identical reference numerals may be used for the same constituent elements in the drawings, and duplicate descriptions thereof may be omitted.

Hereinafter, a horizontal length may mean a length of a plurality of strip guides 60 in an extension direction of the plurality of strip guides 60, a horizontal width may mean the horizontal length of the strip guide 60 on a cross-section vertical to the extension direction of the plurality of strip guides 60, and a vertical height may mean a vertical length of the strip guide 60 on a cross-section vertical to the extension direction of the plurality of strip guides 60.

Figure 1B:
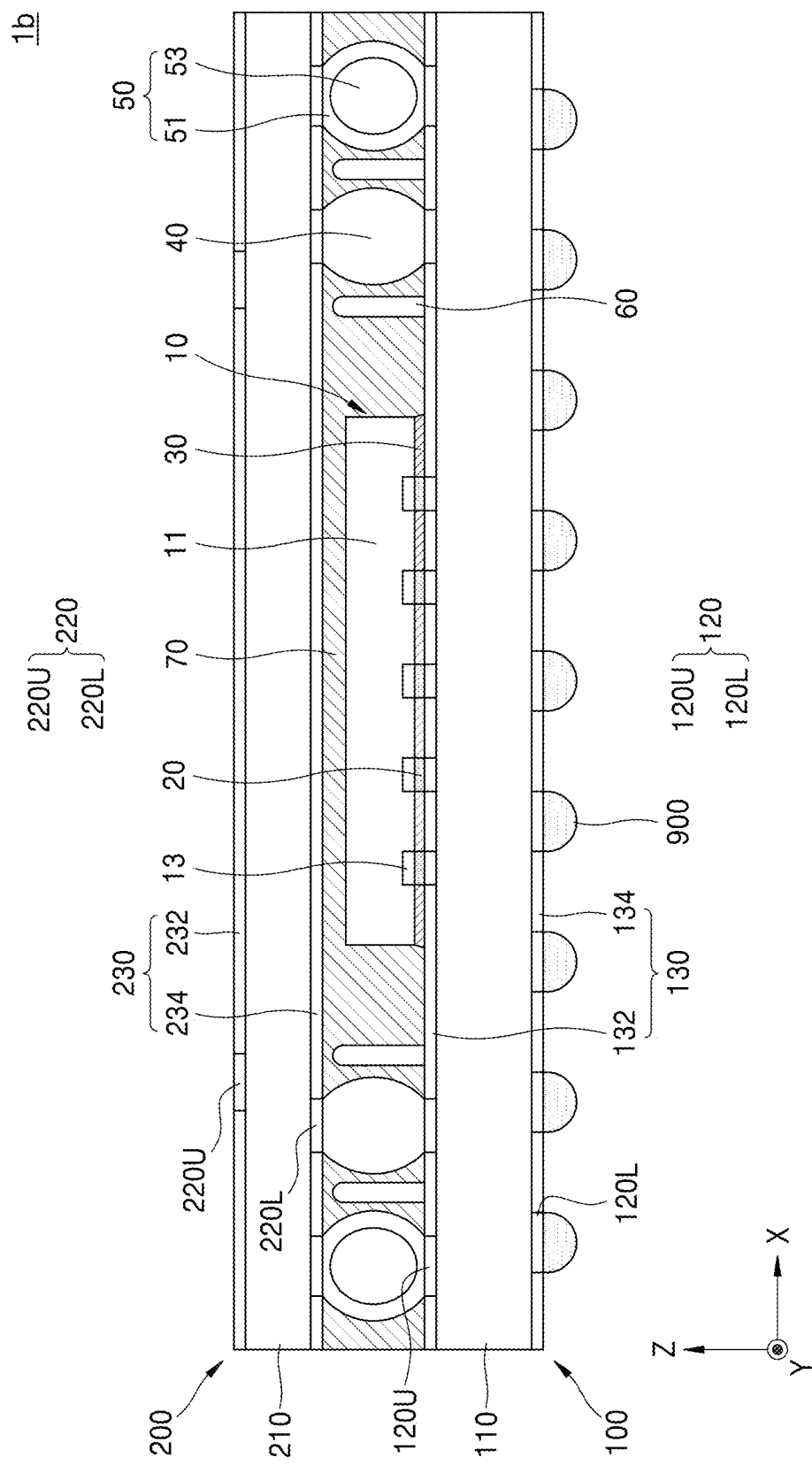
Figure 1C:
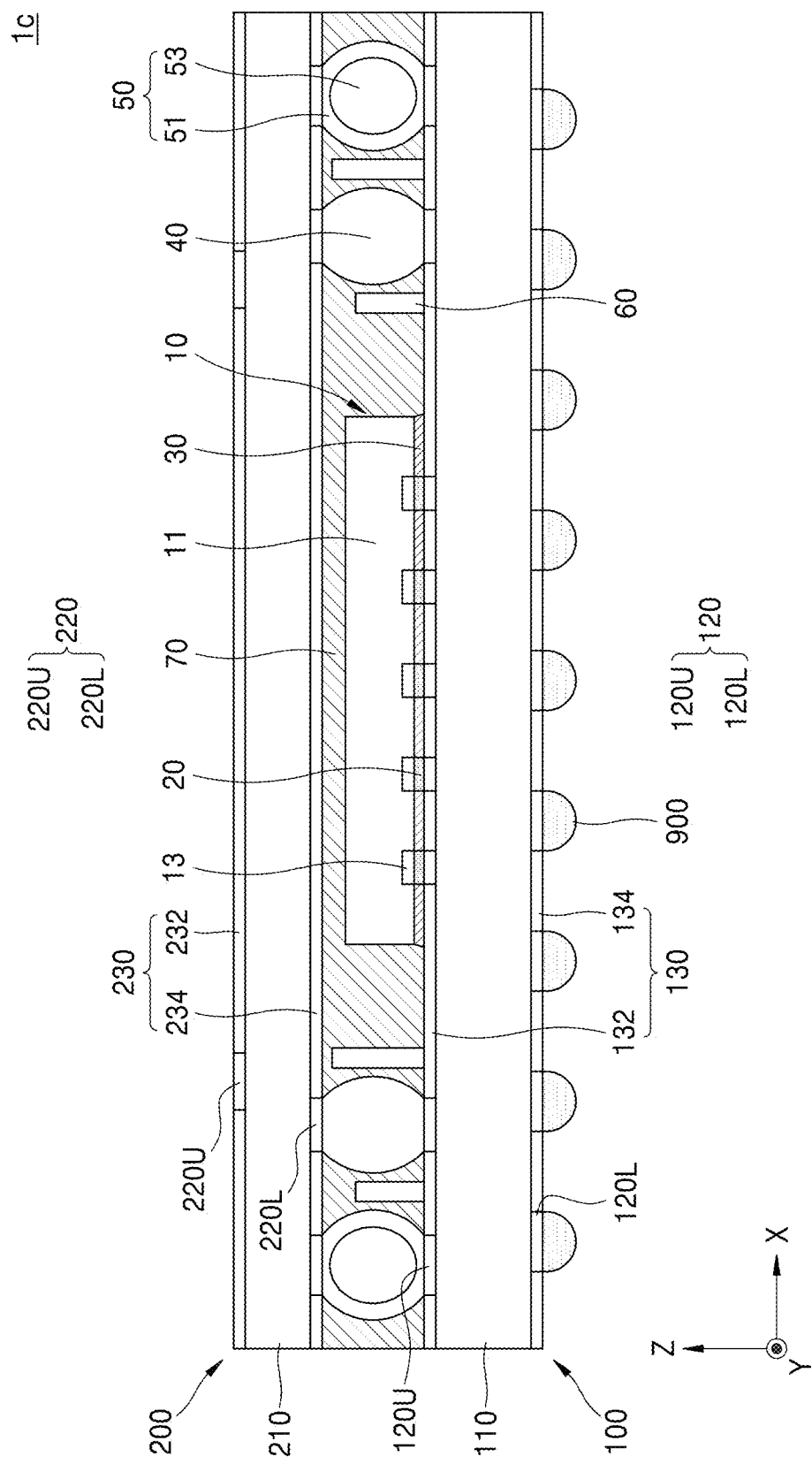

FIG. 1A is a schematic cross-sectional view of a semiconductor package 1a according to an example embodiment. FIG. 1B is a cross-sectional view of a semiconductor package 1b according to an example embodiment. FIG. 1C is a cross-sectional view of a semiconductor package 1c according to an example embodiment.

Referring to FIG. 1A, the semiconductor package 1a may include a first package substrate 100, a semiconductor chip 10 arranged on the first package substrate 100, and a second package substrate 200 arranged over the first package substrate 100 and the semiconductor chip 10.

The first package substrate 100 may include a first substrate base 110 and a plurality of first pads 120. The plurality of first pads 120 may include a plurality of first upper surface pads 120U arranged on an upper surface of the first package substrate 100, and a plurality of first lower surface pads 120L arranged on a lower surface of the first package substrate 100.

In an example embodiment, the first package substrate 100 may include a printed circuit board. For example, the first package substrate 100 may include a multi-layer printed circuit board. However, example embodiments are not limited thereto.

The first substrate base 110 may include at least one material selected from phenol resin, epoxy resin, and polyimide. The first substrate base 110 may include, for example, at least one of frame retardant 4 (FR4), tetrafunctional epoxy, polyphenylene ether, epoxy/polyphenylene oxide, bismaleimide triazine (BT), thermount, cyanate ester, polyimide, and liquid crystal polymer. However, example embodiments are not limited to the above materials.

In an example embodiment, the first pad 120 may include copper. For example, the first pad 120 may include an electronically deposited (ED) copper foil, a rolled-annealed (RA) copper foil, an ultra-thin copper foil, sputtered copper, copper alloys, etc., but example embodiments are not limited thereto.

In an example embodiment, the first package substrate 100 may further include a first solder resist layer 130 covering an upper surface and a lower surface of the first substrate base 110. The first solder resist layer 130 may include a first upper surface solder resist layer 132, which exposes the plurality of first upper surface pads 120U and covers the upper surface of the first substrate base 110, and a first lower surface solder resist layer 134, which exposes the plurality of first lower surface pads 120L and covers the lower surface of the first substrate base 110.

A plurality of external connection terminals 900 may be attached to at least some of the plurality of first lower surface pads 120L. The plurality of external connection terminals 900 may electrically connect the semiconductor package 1a to the outside.

The semiconductor chip 10 may include a semiconductor substrate 11 including an active surface and an inactive surface, which may be opposite to each other, and a plurality of chip pads 13 arranged in a first surface of the semiconductor chip 10. The first surface of the semiconductor chip 10 and a second surface of the semiconductor chip 10 may be opposite to each other, and the second surface of the semiconductor chip 10 may mean the inactive surface of the semiconductor substrate 11.

In an example embodiment, the semiconductor chip 10 may include a central processing unit (CPU) chip, a graphics processing unit (GPU) chip, an application processor (AP) chip, etc. According to another example embodiment, the semiconductor chip 10 may include, for example, a memory semiconductor chip. The memory semiconductor chip may include, for example, a non-volatile memory semiconductor chip such as a flash memory, phase change random access memory (RAM) (PRAM), magnetic RAM (MRAM), ferroelectric RAM (FeRAM), or resistive RAM (RRAM). The flash memory may include, for example, an NAND flash memory, a V-NAND flash memory, etc. In an example embodiment, the semiconductor chip 10 may include a volatile memory semiconductor chip such as dynamic RAM (DRAM), static RAM (SRAM), etc.

The semiconductor substrate 11 may include, for example, a Group IV semiconductor such as silicon (Si) and germanium (Ge), a Group IV-IV compound semiconductor such as silicon-germanium (SiGe) and silicon carbide (SiC), a Group III-V semiconductor such as gallium arsenide (GaAs), indium arsenide (InAs), and indium phosphide (InP), etc., but example embodiments are not limited thereto. The semiconductor substrate 11 may include a conductive region, for example, a well doped with impurities. The semiconductor substrate 11 may have various element isolation structures such as a shallow trench isolation (STI) structure.

A semiconductor device including a plurality of individual devices of various types may be formed on the active surface of the semiconductor substrate 11. The plurality of individual devices may include various microelectronic devices, for example, a metal-oxide-semiconductor field effect transistor (MOSFET) such as a complementary metal-oxide-semiconductor (CMOS) transistor, an image sensor such as system large scale integration (LSI) and a CMOS imaging sensor (CIS), a micro electro-mechanical system (MEMS), an active element, a passive element, etc. The plurality of individual devices may be electrically connected to the conductive region of the semiconductor substrate 11. A semiconductor device may further include a conductive wiring or a conductive plug, which electrically connects at least two of the plurality of individual devices to each other, connects the plurality of individual devices to the conductive region of the semiconductor substrate 11, etc. In addition, each of the plurality of individual devices may be electrically separated from another adjacent individual devices by an insulation layer.

In an example embodiment, the semiconductor chip 10 may have a face down arrangement, in which the first surface thereof is toward the first package substrate 100, and may be arranged on the first package substrate 100. In some example embodiments, a plurality of chip connection members 20 may be arranged between the plurality of chip pads 13 of the semiconductor chip 10 and some of the plurality of first upper surface pads 120U of the first package substrate 100. The plurality of chip connection members 20 may include, for example, a solder ball, a bump, etc., but are not limited thereto. The semiconductor chip 10 and the first package substrate 100 may be electrically connected to each other via the plurality of chip connection members 20.

In an example embodiment, an underfill layer 30 may be arranged between the first surface of the semiconductor chip 10 and the upper surface of the first package substrate 100. The underfill layer 30 may surround the plurality of chip connection members 20. The underfill layer 30 may include, for example, epoxy resin formed by using a capillary underfill method.

The second package substrate 200 may be arranged over the first package substrate 100 and the semiconductor chip 10. The second package substrate 200 may be apart from the semiconductor chip 10 in a vertical direction (e.g., Z direction).

The second package substrate 200 may include a second substrate base 210, and a plurality of second pads 220. The plurality of second pads 220 may include a second upper surface pad 220U arranged on an upper surface of the second substrate base 210 and a second lower surface pad 220L arranged on a lower surface of the second substrate base 210. The second package substrate 200, the second substrate base 210, and the plurality of second pads 220 may be generally similar to the first package substrate 100, the first substrate base 110, and the plurality of first pads 120, respectively, and descriptions may be provided herein based on differences therebetween.

In an example embodiment, the second package substrate 200 may include a printed circuit board. For example, the second package substrate 200 may include a multi-layer printed circuit board. According to another example embodiment, the second package substrate 200 may include a redistribution structure including a redistribution line, a redistribution via, and a redistribution insulating layer surrounding the redistribution line and the redistribution via. In another example embodiment, the second package substrate 200 may include an interposer substrate. In some example embodiments, the second package substrate 200 may include a base layer and a wiring structure.

In an example embodiment, the second package substrate 200 may include a second solder resist layer 230 covering the upper surface and the lower surface of the second substrate base 210. The second solder resist layer 230 may include a second upper surface solder resist layer 232, which exposes the plurality of second upper surface pads 220U and covers the upper surface of the second substrate base 210, and a second lower surface solder resist layer 234, which exposes the plurality of second lower surface pads 220L and covers the lower surface of the second substrate base 210.

In an example embodiment, a horizontal direction length and a horizontal area of the first package substrate 100 may be the same or substantially the same as a horizontal direction length and a horizontal area of the second package substrate 200.

A molding layer 70 may fill a space between the first package substrate 100 and the second package substrate 200, and surround the semiconductor chip 10. The molding layer 70 may cover the upper surface of the first package substrate 100, a lower surface of the second package substrate 200, and both sidewalls of the underfill layer 30. In an example embodiment, the molding layer 70 may fill a space between the second surface of the semiconductor chip 10 and the lower surface of the second package substrate 200 so that the semiconductor chip 10 is apart from the second package substrate 200. The molding layer 70 may include, for example, epoxy molding compound (EMC), but is not limited thereto.

A plurality of solder balls 40 may connect between the plurality of first upper surface pads 120U and the plurality of second lower surface pads 220L. In some example embodiments, upper surfaces of the plurality of solder balls 40 may contact the plurality of second lower surface pads 220L, and lower surfaces of the plurality of solder balls 40 may contact the plurality of first upper surface pads 120U. The plurality of solder balls 40 may have a rugby ball shape in which a vertical height thereof is greater than a horizontal width thereof. For example, the vertical height of the plurality of solder balls 40 may be in a range from about 150 µm to about 250 µm, and the horizontal width of the plurality of solder balls 40 may be in a range from about 60 µm to about 140 µm. A pitch between the plurality of solder balls 40 may be, for example, in a range from about 220 µm to about 300 µm. The plurality of solder balls 40 may include a conductive solder. For example, the plurality of solder balls 40 may include at least one of tin, silver, and copper, but example embodiments are not limited thereto.

A plurality of core structures 50 may be arranged between the first package 100 and the second package substrate 200. In an example embodiment, at least some of the plurality of core structures 50 may connect between the plurality of first upper surface pads 120U and the plurality of second lower surface pads 220L. In other words, upper surfaces and lower surfaces of some of the plurality of core structures 50 may contact the plurality of second lower surface pads 220L and the plurality of first upper surface pads 120U, respectively, and upper surfaces and lower surfaces of some other core structures 50 may not contact the plurality of second lower surface pads 220L and the plurality of first upper surface pads 120U, respectively. In an example embodiment, each of the plurality of core structures 50 may include a core layer 53 and a solder layer 51 surrounding the core layer 53. In some example embodiments, the solder layers 51 of some of the plurality of core structures 50 connecting between the plurality of first upper surface pads 120U and the plurality of second lower surface pads 220L may contact the second lower surface pad 220L and the first upper surface pad 120U. In an example embodiment, the core layer 53 may include copper (Cu), but is not limited thereto. In an example embodiment, the solder layer 51 may include a conductive solder. For example, the solder layer 51 may include at least one of tin (Sn), silver (Ag), and Cu, but is not limited thereto.

In an example embodiment, the plurality of core structures 50 may have a rugby ball shape, in which a horizontal width thereof is greater than a vertical height thereof. In some example embodiments, the core layer 53 may have a rugby ball shape, in which a horizontal width thereof is greater than a vertical height thereof, and with the solder layer 51 surrounding the core layer 53, the solder layer 51 may have a rugby ball shape, in which a horizontal width of the plurality of core structures 50 is greater than a vertical height thereof. However, example embodiments are not limited thereto, and for example, the core layer 53 may have a rugby ball shape, in which the horizontal width is the same or substantially the same as the vertical height, and with the solder layer 51 surrounding the core layer 53, the plurality of core structures 50 may also have a rugby ball shape, in which the horizontal width is greater than the vertical height. In some example embodiments, the horizontal width and the vertical height of the plurality of core structures 50 may be in a range from about 150 µm to about 250 µm, and in such a range, the horizontal width may be greater than the vertical height. However, example embodiments are not limited thereto, and the plurality of core structures 50 may have a spherical shape, in which the horizontal width is the same or substantially the same as the vertical height. In some example embodiments, a diameter of the plurality of core structures 50 having a spherical shape may be in a range from about 150 μm to about 250 μm.

In an example embodiment, the vertical height of the plurality of core structures 50 may be the same or substantially the same as a vertical height of the plurality of solder balls 40, and the horizontal width of the plurality of core structures 50 may be greater than a horizontal width of the plurality of solder balls 40. For example, the vertical heights of the plurality of core structures 50 and the plurality of solder balls 40 may be the same or substantially the same as each other in a range of about 150 μm to about 250 μm, and the horizontal widths of the plurality of core structures 50 and the horizontal widths of the plurality of solder balls 40 may be in a range about 150 μm to about 250 μm and about 60 μm to about 140 μm, respectively.

Because the plurality of core structures 50 are arranged between the first package substrate 100 and the second package substrate 200, and a space between the first package substrate 100 and the second package substrate 200 may be maintained by the plurality of core structures 50, warpage of the semiconductor package 1a may be reduced or prevented, and the structural reliability of the semiconductor package 1a may be improved.

Figure 2A:
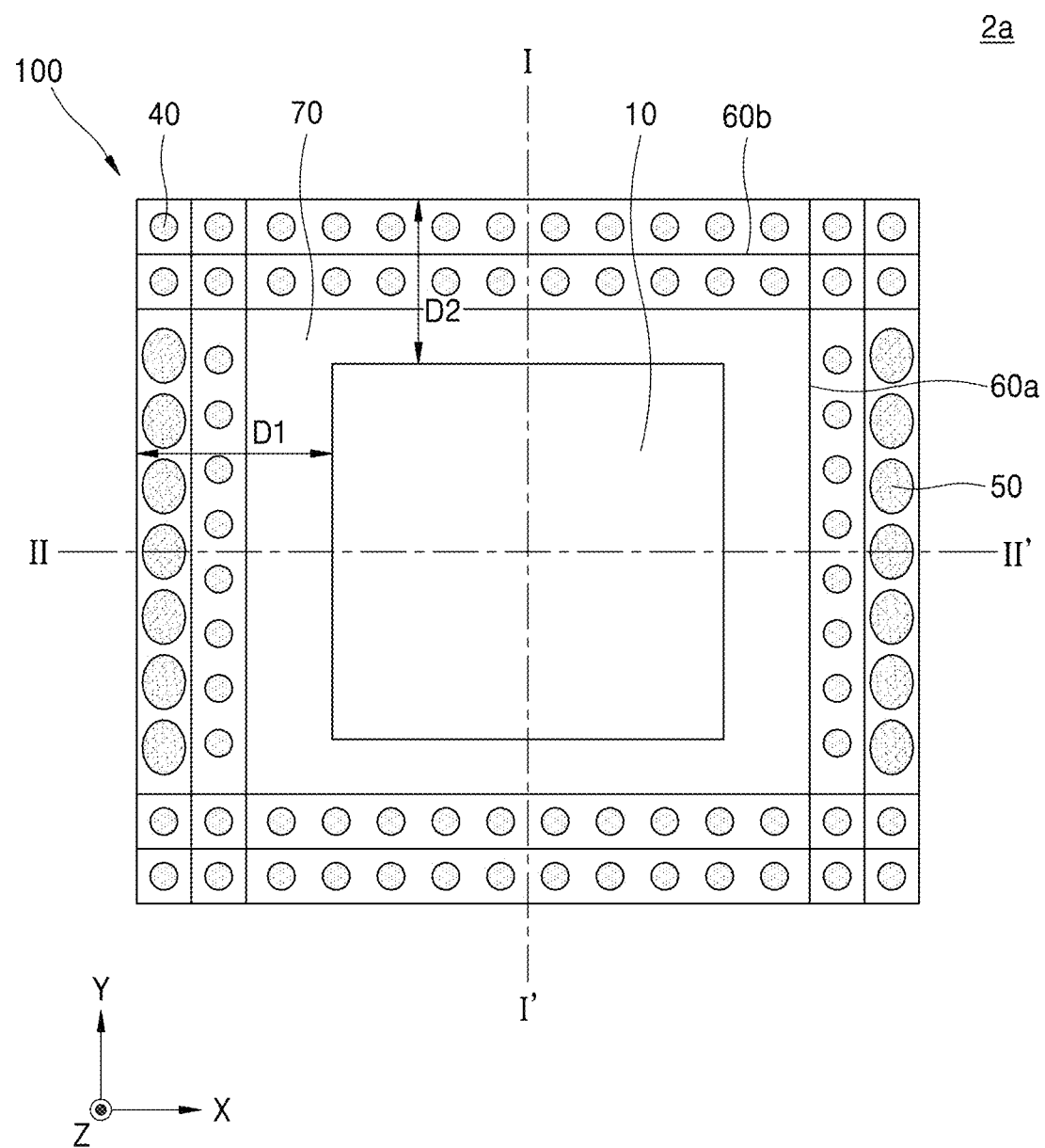
FIGS. 2A, 2B, 2C and 2D are planar layout diagrams of planar arrangements of semiconductor packages, according to some example embodiments.

The strip guide 60 may be arranged between the first package substrate 100 and the second package substrate 200, and may be arranged on the first package substrate 100. The strip guide 60 may be two-dimensionally apart from the semiconductor chip 10, and may extend in a second horizontal direction (e.g., Y direction). In an example embodiment, the strip guide 60 may be two-dimensionally arranged between the semiconductor chip 10 and the plurality of core structures 50. For example, as illustrated in FIG. 2A, a first portion of the strip guides 60 may be spaced apart from the semiconductor chip 10 in a first dimension direction (such as the dimension I-I'), and another portion of the strip guides 60 may be spaced apart from the semiconductor chip 10 in a second dimension direction that is different from the first dimension direction (such as the dimension II-II'). In some example embodiments, the first dimension direction and the second dimension direction may be perpendicular to one another.

In an example embodiment, a horizontal length of the strip guide 60 may be substantially the same as a horizontal length of the first package substrate 100. In other words, the horizontal length of the strip guide 60 may be the same as, or similar to but somewhat less than the horizontal length of the first package substrate 100. For example, the horizontal length of the first package substrate 100 and the horizontal length of the strip guide 60 may be about 14 mm. In an example embodiment, the vertical height of the strip guide 60 may be in a range from about 0.5 times to about 1 time the vertical height of the plurality of core structures 50 and the plurality of solder balls 40. For example, the vertical height of the plurality of core structures 50 and the plurality of solder balls 40 may be in a range from about 150 μm to about 250 μm, for example, about 200 μm, and in some example embodiments, the vertical height of the strip guide 60 may be in a range from about 100 μm to about 200 μm.

In an example embodiment, a horizontal width of the strip guide 60 may be in a range from about 20 μm to about 40 μm. For example, the horizontal width of the strip guide 60 may be about 30 μm.

Referring to FIG. 1B, a cross-section of the strip guide 60 vertical to an extension direction of the strip guide 60 may have a rectangular shape, in which the vertical height thereof is greater than the horizontal width thereof, but example embodiments are not limited thereto, and for example, the cross-section of the strip guide 60 vertical to the extension direction of the strip guide 60 may have a shape, in which an upper surface thereof is convex. Unlike as illustrated in FIG. 1B, the cross-section of some of the plurality of strip guides 60 may have a rectangular shape, in which the vertical height thereof is greater than the horizontal width thereof, and the cross-section of some other strip guides 60 may also have a shape in which the upper surface thereof is convex.

Referring to FIG. 1C, the vertical height of some of the plurality of strip guides 60 may be different from the vertical height of some other strip guides 60. For example, the vertical height of some of the plurality of strip guides 60 may be about 100 μm, and the vertical height of some other strip guides 60 may be about 150 μm.

In an example embodiment, the strip guide 60 may include at least one of Cu, Ag, gold, tungsten, titanium, and aluminum. However, example embodiments are not limited thereto, and for example, the strip guide 60 may include an insulation material such as silicon oxide ($SiO_2$), silicon nitride (SiN), silicon oxynitride (SiON), but example embodiments are not limited thereto.

Because the strip guide 60 is arranged between the first package substrate 100 and the second package substrate 200, and extends in the second direction (e.g., Y direction), warpage of the semiconductor package 1a may be reduced or prevented, and the structural reliability of the semiconductor package 1a may be improved. In addition, because the strip guide 60 is arranged between the semiconductor chip 10 and the plurality of core structures 50, the plurality of core structures 50 may be reduced or prevented from being separated in a direction of the semiconductor chip 10, and the reliability of electrical connection between the semiconductor chip 10 and the first package substrate 100 may be improved.

FIGS. 2A through 2D are planar layout diagrams of planar arrangements of core structures 50 of semiconductor packages 2a, 2b, 2c, and 2d, according to example embodiments. The semiconductor packages 2a, 2b, 2c, and 2d illustrated in FIGS. 2A through 2D may correspond to the semiconductor packages 1a, 1b, and 1c, which are respectively illustrated in FIGS. 1A, 1B, and 1C, and in the descriptions of FIGS. 2A through 2D, duplicate descriptions of FIGS. 1A through 1C may be omitted.

Referring to FIGS. 1A and 2A, the semiconductor package 2a may include the first package substrate 100, the second package substrate 200, the semiconductor chip 10 arranged on the first package substrate 100, the plurality of solder balls 40 arranged between the first package substrate 100 and the second package substrate 200, the plurality of core structures 50, and the strip guide 60. The molding layer 70 may fill the space between the first package substrate 100 and the second package substrate 200, and surround the semiconductor chip 10, the plurality of solder balls 40, the plurality of core structures 50, and the strip guide 60.

Two-dimensionally, the semiconductor chip 10 may be arranged in a central portion of the first package substrate 100 and the second package substrate 200, and the plurality of solder balls 40 and the plurality of core structures 50 may be apart from the semiconductor chip 10, and arranged in rows along a periphery of the semiconductor chip 10 on portions adjacent to the edges of the first package substrate 100 and the second package substrate 200. In some example embodiments, each of the plurality of solder balls 40 may be apart from each of the plurality of core structures 50.

In an example embodiment, the plurality of core structures 50 may be arranged in a row in portions adjacent to two opposite edges among four edges of each of the first package substrate 100 and the second package substrate 200 along the two edges, and may not be arranged in portions adjacent to the other two opposite edges thereof.

The two opposite edges of the four edges of the first package substrate 100 may be two-dimensionally apart from the two opposite edges corresponding thereto of the four edges of the semiconductor chip 10 by a first distance D1, and the other two opposite edges of the four edges of the first package substrate 100 may be two-dimensionally apart from the other two opposite edges corresponding thereto of the four edges of the semiconductor chip 10 by a second distance D2. In an example embodiment, the first distance D1 may be greater than the second distance D2.

In an example embodiment, the plurality of core structures 50 may be arranged between two opposite edges of the first package substrate 100 and two opposite edges corresponding thereto of the semiconductor chip 10, which are apart from each other by the first distance D1, which is relatively greater, and may not be arranged between the other two opposite edges of the first package substrate 100 and the other two opposite edges corresponding thereto of the semiconductor chip 10, which are apart from each other by the second distance D2, which is relatively smaller. In some example embodiments, the plurality of solder balls 40 may be arranged between the other two opposite edges of the first package substrate 100, where the plurality of core structures 50 are not arranged, and the other two opposite edges corresponding thereto of the semiconductor chip 10.

In an example embodiment, each of the plurality of core structures 50 may be arranged symmetrical with respect to a first imaginary center line I-I', which passes through the centers of the first package substrate 100 and the second package substrate 200 and extends in the second horizontal direction (e.g., Y direction).

In an example embodiment, the strip guide 60 may include a plurality of first sub-strip guides 60a extending in the second horizontal direction (e.g., Y direction) and a plurality of second sub-strip guides 60b extending in the first horizontal direction (e.g., X direction). In an example embodiment, the plurality of first sub-strip guides 60a and the plurality of second sub-strip guides 60b may vertically cross each other.

In an example embodiment, a horizontal length of the plurality of first sub-strip guides 60a extending in the second horizontal direction (e.g., Y direction) may be substantially the same as the length of the first package substrate 100 in the second horizontal direction (e.g., Y direction). In other words, the horizontal length of the plurality of first sub-strip guides 60a may be the same as, similar to, or somewhat less than the length of the first package substrate 100 in the second horizontal direction (e.g., Y direction). A horizontal length of the plurality of second sub-strip guides 60b extending in the first horizontal direction (e.g., X direction) may be substantially the same as the length of the first package substrate 100 in the first horizontal direction (e.g., X direction). In other words, the horizontal length of the plurality of second sub-strip guides 60b may be the same as, similar to, or somewhat less than the length of the first package substrate 100 in the first horizontal direction (e.g., X direction). For example, the length of the first package substrate 100 in the second horizontal direction (e.g., Y direction) and the horizontal length of the plurality of first sub-strip guides 60a may be about 14 mm, and the length of the first package substrate 100 in the first horizontal direction (e.g., X direction) and the horizontal length of the plurality of second sub-strip guides 60b may be about 13.9 mm, but example embodiments are not limited thereto.

The plurality of first sub-strip guides 60a may be arranged between two opposite edges of the first package substrate 100 and two opposite edges corresponding thereto of the semiconductor chip 10, which have the first distance D1 therebetween, and the plurality of second sub-strip guides 60b may be arranged between the other two opposite edges of the first package substrate 100 and the other two opposite edges corresponding thereto of the semiconductor chip 10, which have the second distance D2 therebetween. In some example embodiments, the plurality of first sub-strip guides 60a may be arranged apart from each other, and the plurality of second sub-strip guides 60b may be arranged apart from each other.

In an example embodiment, some of the plurality of first sub-strip guides 60a may be arranged between the plurality of core structures 50 and the plurality of solder balls 40, and some other first sub-strip guides 60a may be arranged between the plurality of solder balls 40 and the semiconductor chip 10, and some of the plurality of second sub-strip guides 60b may be arranged between each of the plurality of solder balls 40, and some other of the plurality of second sub-strip guides 60b may be arranged between the plurality of solder balls 40 and the semiconductor chip 10. In some example embodiments, the plurality of first sub-strip guides 60a may be apart from the plurality of core structures 50 and the plurality of solder balls 40, and the plurality of second sub-strip guides 60b may be apart from the plurality of solder balls 40. In an example embodiment, a space width between each of the plurality of first sub-strip guides 60a and a space width between each of the plurality of second sub-strip guides 60b may be the same or substantially the same as a pitch between each of the plurality of solder balls 40. For example, the space width between each of the plurality of first sub-strip guides 60a, the space width between each of the plurality of second sub-strip guides 60b, and the pitch between each of the plurality of solder balls 40 may be in a range from about 220 µm to about 300 µm.

In an example embodiment, the plurality of first sub-strip guides 60a may be arranged symmetrical with respect to the first imaginary center line I-I', which passes through the centers of the first package substrate 100 and the second package substrate 200 and extends in the second horizontal direction (e.g., Y direction). The plurality of second sub-strip guides 60b may be arranged symmetrical with respect to a second imaginary center line II-II', which passes through the centers of the first package substrate 100 and the second package substrate 200 and extends in the first horizontal direction (e.g., X direction).

In an example embodiment, a vertical height of the plurality of first and second sub-strip guides 60a and 60b may be in a range from about 0.5 times to about 1 time the vertical height of the plurality of core structures 50 and the plurality of solder balls 40. For example, the vertical height of the plurality of core structures 50 and the plurality of solder balls 40 may be in a range from about 150 µm to about 250 µm, for example, about 200 µm, and in some example embodiments, the vertical height of the plurality of first and second sub-strip guides 60a and 60b may be in a range from about 100 μm to about 200 μm.

Referring to FIGS. 1C and 2A, a vertical height of some of the plurality of first and second sub-strip guides 60a and 60b may be different from a vertical height of some other first and second sub-strip guides 60a and 60b, and for example, the vertical height of some of the plurality of first and second sub-strip guides 60a and 60b may be about 100 μm, and the vertical height of some other first and second sub-strip guides 60a and 60b may be about 150 μm, but example embodiments are not limited thereto.

When the plurality of core structures 50 are arranged between two edges of the first package substrate 100 and two edges corresponding thereto of the semiconductor chip 10, warpage of the semiconductor package 2a may be reduced or prevented, and the structural reliability of the semiconductor package 2a may be improved.

In addition, because the plurality of first sub-strip guides 60a and the plurality of second sub-strip guides 60b are arranged between the first package substrate 100 and the second package substrate 200, the plurality of first sub-strip guides 60a extend in the second horizontal direction (e.g., Y direction), and the plurality of second sub-strip guides 60b extend in the first horizontal direction (e.g., X direction), warpage of the semiconductor package 2a may be reduced or prevented, and the structural reliability of the semiconductor package 2a may be improved. In addition, because the plurality of first sub-strip guides 60a are arranged between the semiconductor chip 10 and the plurality of core structures 50, the plurality of core structures 50 may be reduced or prevented from being separated in the direction of the semiconductor chip 10, and the reliability of electrical connection between the semiconductor chip 10 and the first package substrate 100 may be improved.

Figure 2B:
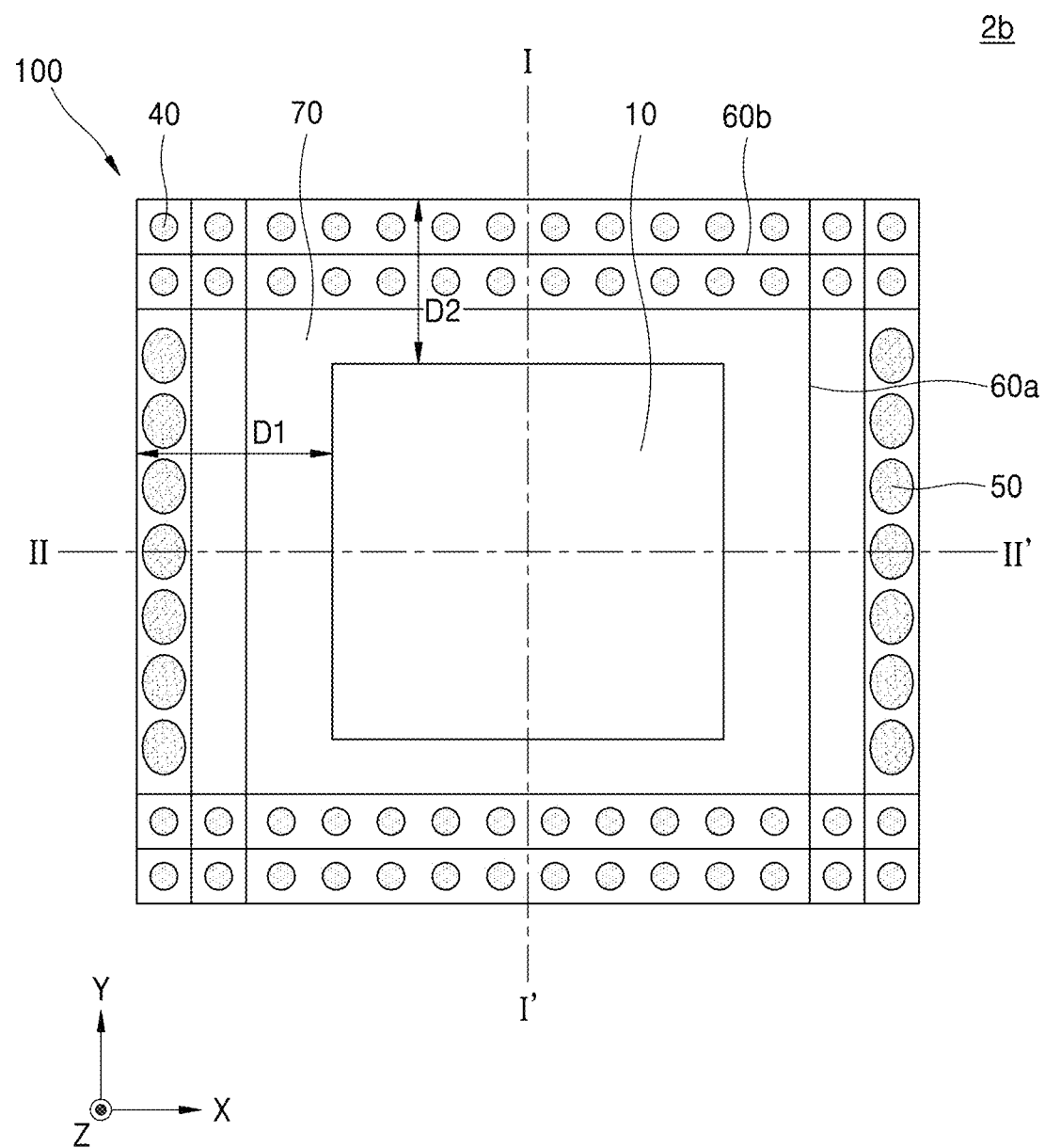

Referring to FIG. 2B, the semiconductor package 2b may include the first package substrate 100, the second package substrate 200, the semiconductor chip 10 arranged on the first package substrate 100, the plurality of solder balls 40 arranged between the first package substrate 100 and the second package substrate 200, the plurality of core structures 50, and the plurality of first and second sub-strip guides 60a and 60b. The molding layer 70 may fill the space between the first package substrate 100 and the second package substrate 200, and surround the semiconductor chip 10, the plurality of solder balls 40, the plurality of core structures 50, and the plurality of first and second sub-strip guides 60a and 60b. Hereinafter, differences from FIG. 2A are mainly described.

In an example embodiment, the plurality of core structures 50 may be arranged in a row between two opposite edges of the first package substrate 100 and two opposite edges corresponding thereto of the semiconductor chip 10, which are apart from each other by the first distance D1, which is relatively greater, and the plurality of solder balls 40 may not be arranged between the other two opposite edges of the first package substrate 100 and the other two opposite edges corresponding thereto of the semiconductor chip 10, which are apart from each other by the first distance D1, which is relatively greater.

Figure 2C:
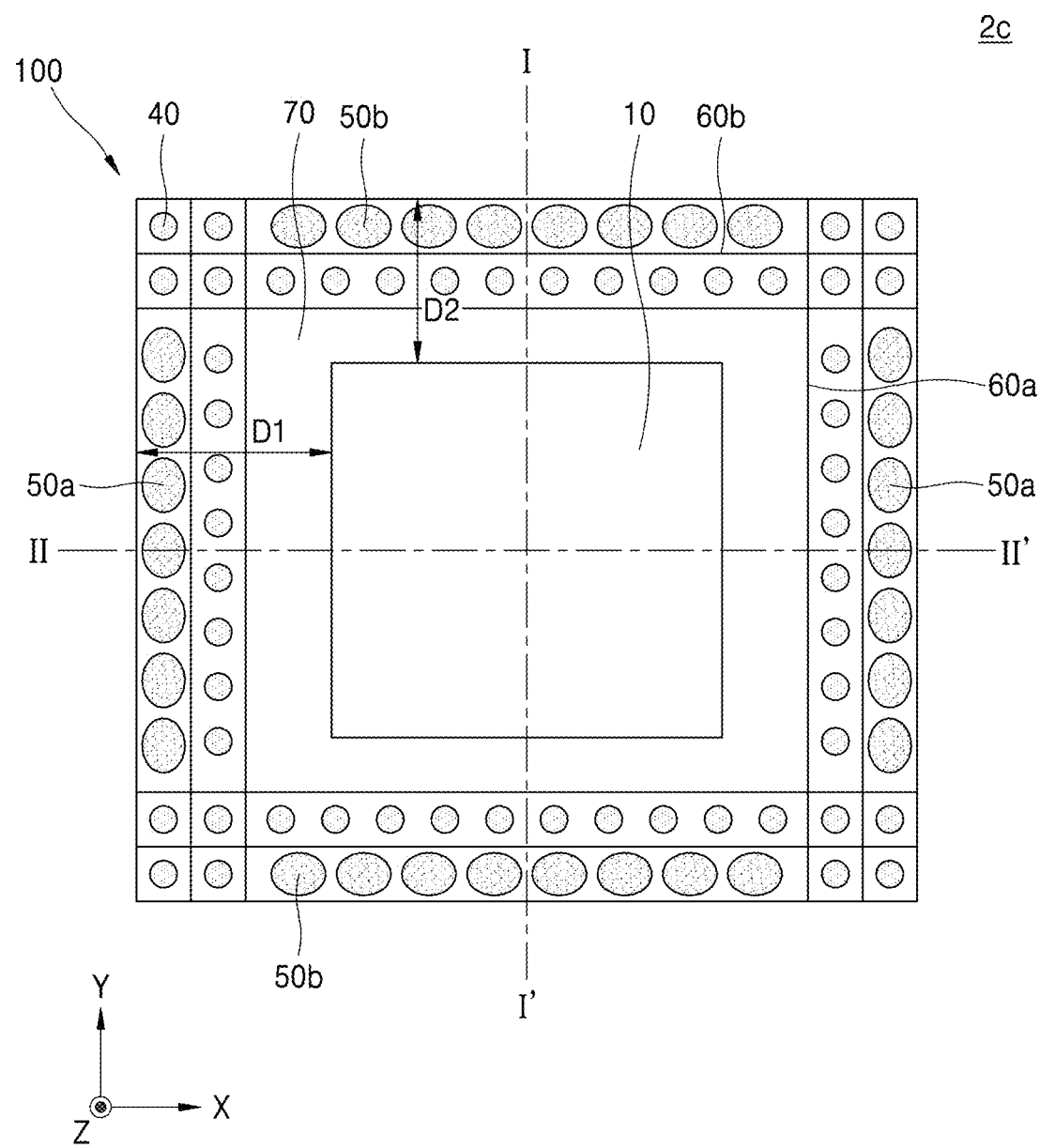

Referring to FIG. 2C, the semiconductor package 2c may include the first package substrate 100, the second package substrate 200, the semiconductor chip 10 arranged on the first package substrate 100, the plurality of solder balls 40 arranged between the first package substrate 100 and the second package substrate 200, a plurality of core structures 50a and 50b, and the plurality of first and second sub-strip guides 60a and 60b. The molding layer 70 may fill the space between the first package substrate 100 and the second package substrate 200, and surround the semiconductor chip 10, the plurality of solder balls 40, the plurality of core structures 50a and 50b, and the plurality of first and second sub-strip guides 60a and 60b. Hereinafter, differences from FIG. 2A are mainly described.

Two-dimensionally, the semiconductor chip 10 may be arranged in a central portion of the first package substrate 100 and the second package substrate 200, and the plurality of solder balls 40 and the plurality of core structures 50a and 50b may be apart from the semiconductor chip 10, and arranged along the periphery of the semiconductor chip 10 on portions adjacent to the edges of the first package substrate 100 and the second package substrate 200. For example, the core structures 50a and a first portion of the solder balls 40 may be spaced apart from the semiconductor chip 10 in the dimension direction II-II', while the core structures 50b and a second portion of the solder balls 40 are spaced apart from the semiconductor chip 10 in the dimension direction I-I'. In some example embodiments, the plurality of solder balls 40 and the plurality of core structures 50a and 50b may be respectively apart from each other.

In an example embodiment, the plurality of first and second core structures 50a and 50b may arranged on all four edges of the first package substrate 100 and the second package substrate 200.

In an example embodiment, the plurality of core structures 50a and 50b may be arranged in rows between two opposite edges of the first package substrate 100 and two opposite edges corresponding thereto of the semiconductor chip 10, which are apart from each other by the first distance D1, which is relatively greater, and between the other two opposite edges of the first package substrate 100 and the other two opposite edges corresponding thereto of the semiconductor chip 10, which are apart from each other by the second distance D2, which is relatively smaller.

In an example embodiment, the plurality of core structures 50a, which are arranged in rows between two opposite edges of the first package substrate 100 and two opposite edges corresponding thereto of the semiconductor chip 10, which are apart from each other by the first distance D1, which is relatively greater, may be arranged symmetrical with respect to the first imaginary center line I-I', which passes through the centers of the first package substrate 100 and the second package substrate 200 and extends in the second horizontal direction (e.g., Y direction), and the plurality of core structures 50b, which are arranged in rows between the other two opposite edges of the first package substrate 100 and two opposite edges corresponding thereto of the semiconductor chip 10, which have the second distance D2, which is relatively lesser, and are apart from each other, may be arranged symmetrical with respect to the second imaginary center line II-II', which passes through the centers of the first package substrate 100 and the second package substrate 200 and extends in the first horizontal direction (e.g., X direction).

When the plurality of core structures 50a and 50b are arranged in all spaces between four edges of the first package substrate 100 and four edges corresponding thereto of the semiconductor chip 10, warpage of the semiconductor package 2c may be reduced or prevented, and the structural reliability of the semiconductor package 2c may be improved.

Figure 2D:
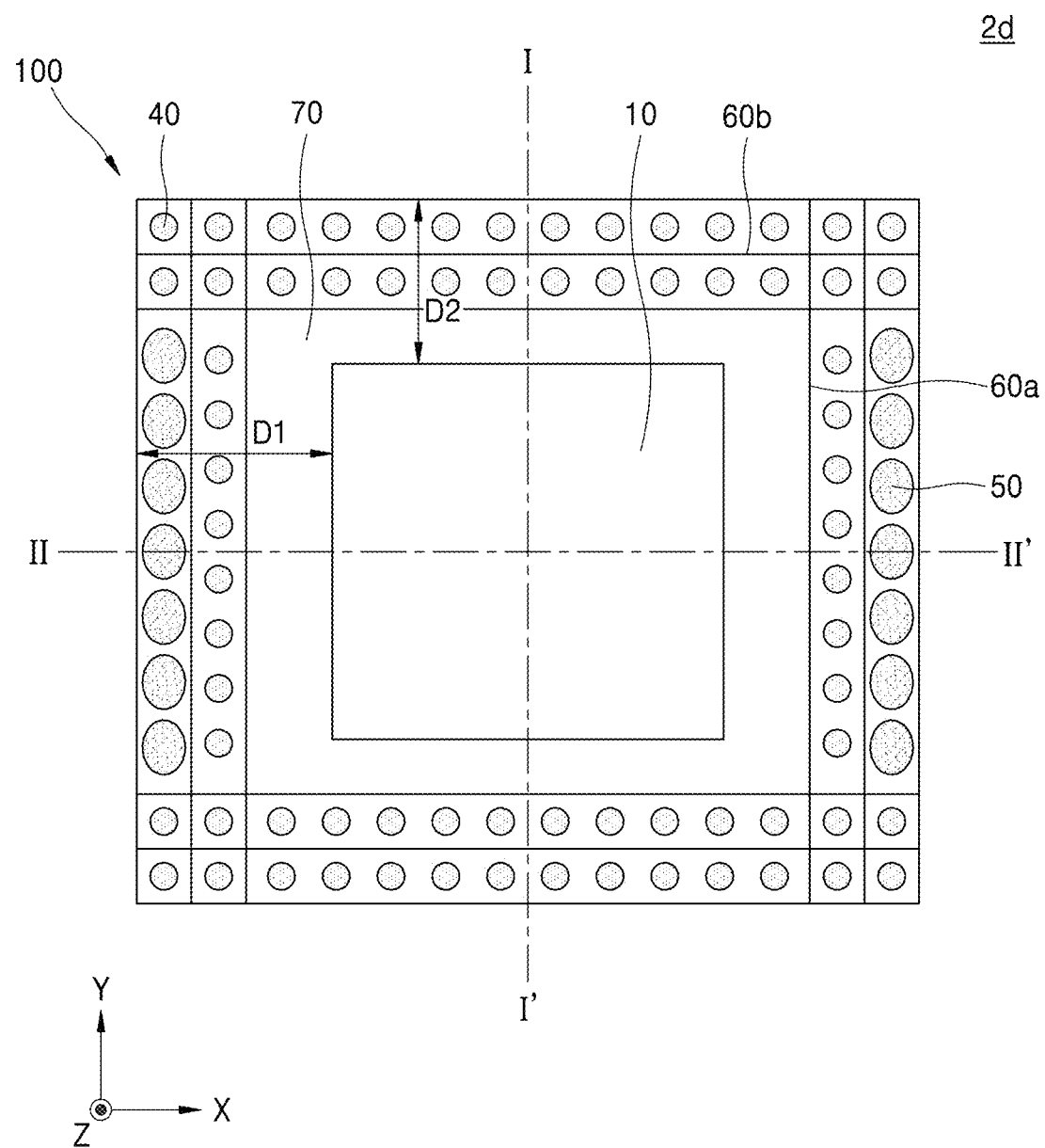

Referring to FIG. 2D, the semiconductor package 2d may include the first package substrate 100, the second package substrate 200, the semiconductor chip 10 arranged on the first package substrate 100, the plurality of solder balls 40 arranged between the first package substrate 100 and the second package substrate 200, the plurality of core structures 50, and the plurality of first and second sub-strip guides 60a and 60b. The molding layer 70 may fill the space between the first package substrate 100 and the second package substrate 200, and surround the semiconductor chip 10, the plurality of solder balls 40, the plurality of core structures 50, and the plurality of first and second sub-strip guides 60a and 60b.

In an example embodiment, the plurality of first sub-strip guides 60a may be arranged between two opposite edges of the first package substrate 100 and two opposite edges corresponding thereto of the semiconductor chip 10, which have the first distance D1 therebetween, and the plurality of second sub-strip guides 60b may be arranged between the other two opposite edges of the first package substrate 100 and the other two opposite edges corresponding thereto of the semiconductor chip 10, which have the second distance D2 therebetween. In an example embodiment, the plurality of first sub-strip guides 60a may be arranged between the semiconductor chip 10 and the plurality of solder balls 40, but may not be arranged between the plurality of core structures 50 and the plurality of solder balls 40, and the plurality of second sub-strip guides 60b may be arranged between the semiconductor chip 10 and the plurality of solder balls 40, but may not be arranged between the plurality of solder balls 40. In an example embodiment, the plurality of first sub-strip guides 60a may be arranged symmetrical with respect to the first imaginary center line I-I', which passes through the centers of the first package substrate 100 and the second package substrate 200 and extends in the second horizontal direction (e.g., Y direction). The plurality of second sub-strip guides 60b may be arranged symmetrical with respect to a second imaginary center line II-II', which passes through the centers of the first package substrate 100 and the second package substrate 200 and extends in the first horizontal direction (X direction).

FIGS. 3A through 3G are cross-sectional views illustrating a method of fabricating a semiconductor package, according to example embodiments.

Figure 3A:
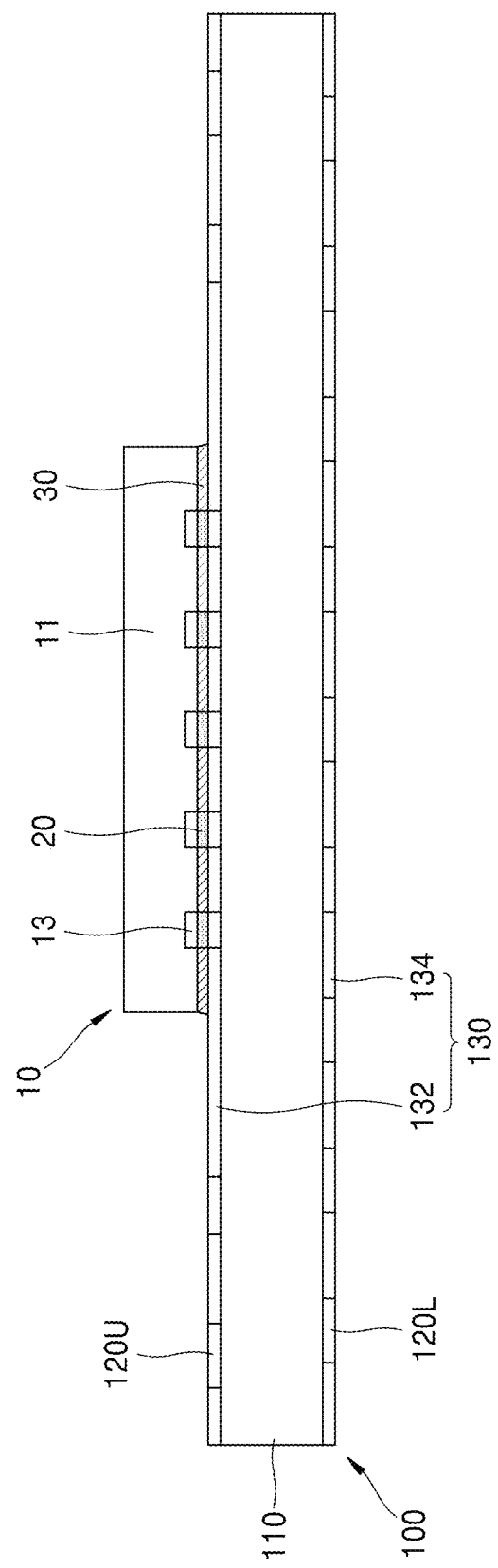
FIGS. 3A, 3B, 3C, 3D, 3E, 3F and 3G are cross-sectional views illustrating a method of fabricating a semiconductor package, according to some example embodiments.

Referring to FIG. 3A, the semiconductor chip 10 may be attached on the first package substrate 100. For example, after the plurality of chip connection members 20 are attached to the plurality of chip pads 13 of the semiconductor chip 10, the plurality of chip connection members 20 may be attached to at least some of the plurality of first upper surface pads 120U of the first package substrate 100, and the semiconductor chip 10 may be attached on the first package substrate 100. The underfill layer 30 may be formed between the semiconductor chip 10 and the first package substrate 100. The underfill layer 30 may, for example, be formed by injecting a resin material into a space between the semiconductor chip 10 and the first package substrate 100 by using a capillary underfill method. The underfill layer 30 may fill a space between the semiconductor chip 10 and the first package substrate 100, and may be formed to surround the plurality of chip connection members 20.

Figure 3B:
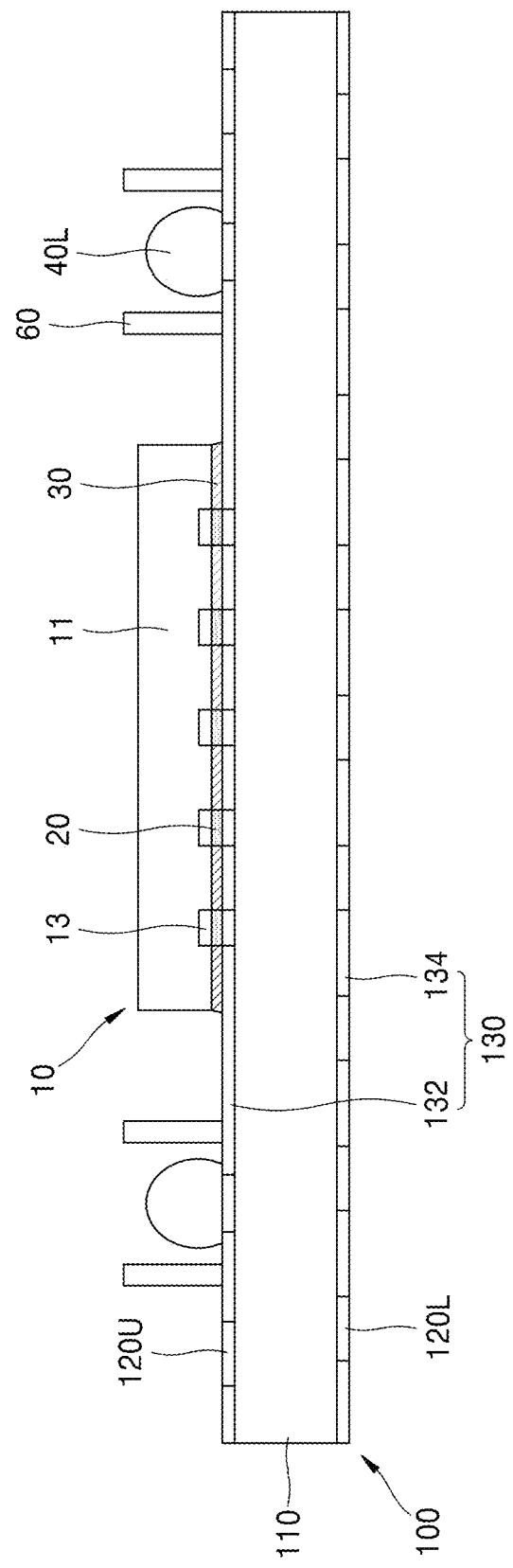

Referring to FIG. 3B, a plurality of lower solder balls 40L may be attached to some other first upper surface pads 120U. The plurality of lower solder balls 40L may include a conductive solder. For example, the plurality of lower solder balls 40 may include at least one of Sn, Ag, and Cu, but example embodiments are not limited thereto. A vertical height of the plurality of lower solder balls 40L may be somewhat greater than about ½ of the vertical height of the plurality of solder balls 40 illustrated in FIGS. 1A through 1C. For example, the vertical height of the plurality of lower solder balls 40L may be in a range from about 75 μm to about 125 μm.

The strip guide 60 may be attached on the upper surface of the first package substrate 100. The strip guide 60 may be attached to be two-dimensionally apart from the semiconductor chip 10. In addition, the strip guide 60 may be attached to be two-dimensionally apart from the plurality of lower solder balls 40L and the plurality of first upper surface pads 120U.

Figure 3C:
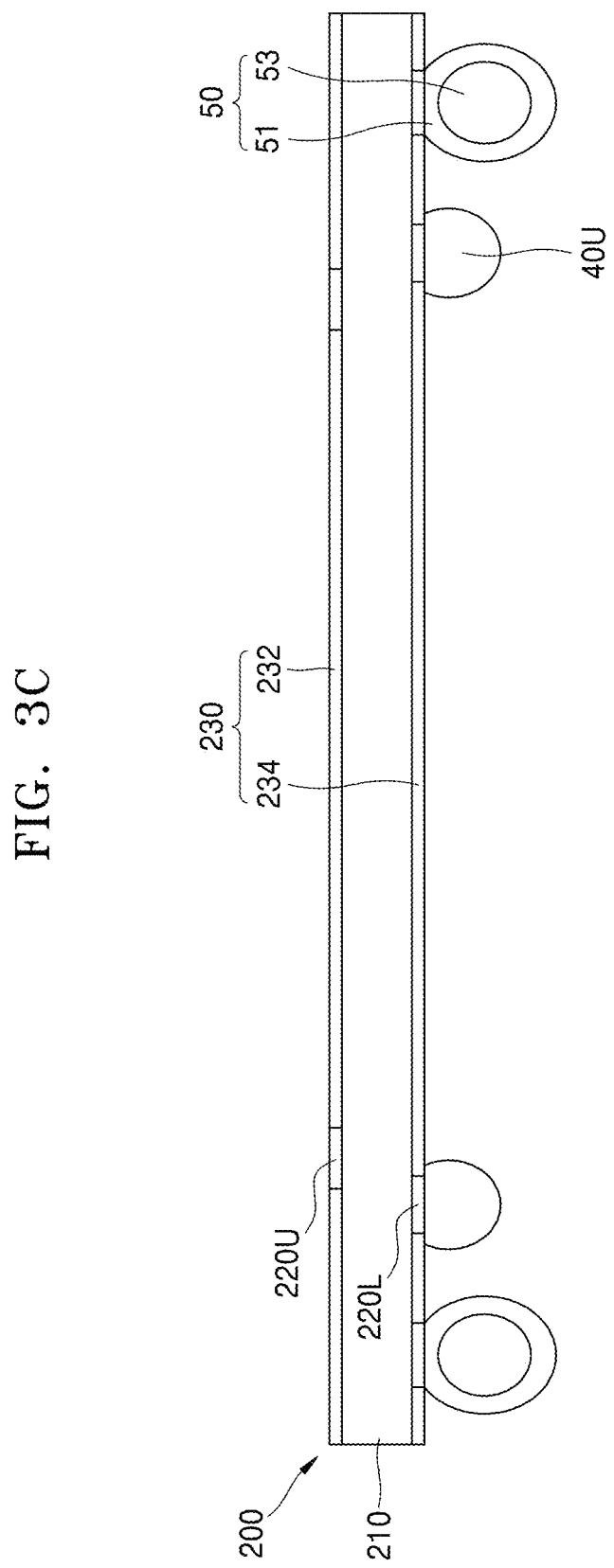

Referring to FIG. 3C, a plurality of upper solder balls 40U may be attached to at least some of the plurality of second lower surface pads 220L of the second package substrate 200. The plurality of upper solder balls 40U may include a conductive solder. For example, the plurality of upper solder balls 40U may include at least one of Sn, Ag, and Cu, but example embodiments are not limited thereto. A vertical height of the plurality of upper solder balls 40U may be somewhat greater than about ½ of the vertical height of the plurality of solder balls 40 illustrated in FIG. 1A. For example, the vertical height of the plurality of upper solder balls 40U may be in a range from about 75 μm to about 125 μm. The plurality of core structures 50 may be attached to the lower surface of the second package substrate 200. In an example embodiment, some of the plurality of core structures 50 may be attached to some other second lower surface pads 220L. In other words, some other core structures 50 may not contact the plurality of second lower surface pads 220L.

Figure 3D:
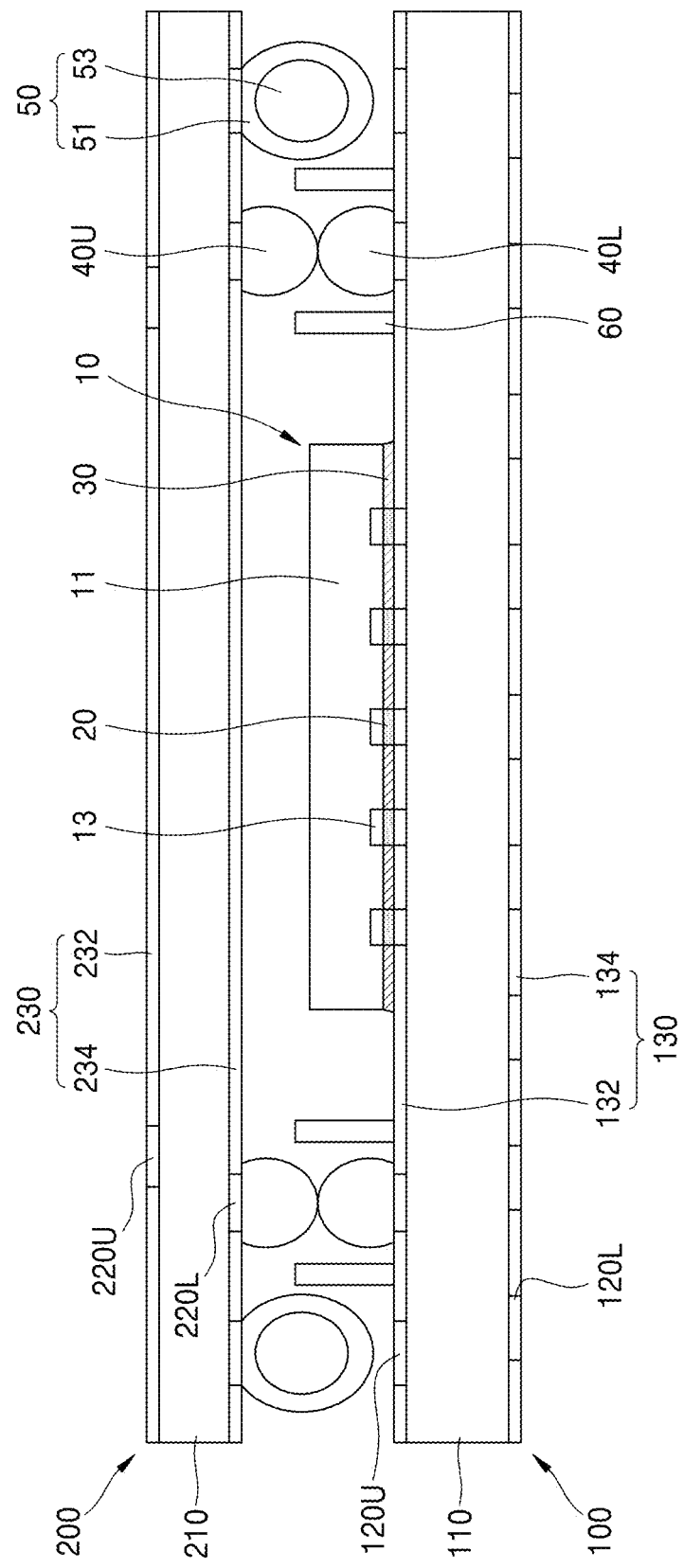

Referring to FIG. 3D, to make the plurality of upper solder balls 40U and the plurality of lower solder balls 40L, which may correspond to each other, and may contact each other, the second package substrate 200, to which the plurality of core structures 50 and the plurality of upper solder balls 40U are attached, may be mounted on the first package substrate 100, to which the plurality of lower solder balls 40L are attached.

Because the plurality of core structures 50 are attached to the lower surface of the second package substrate 200 in a horizontal symmetry, when the second package substrate 200 is mounted on the first package substrate 100, tilting of the second package substrate 200 may not occur.

Figure 3E:
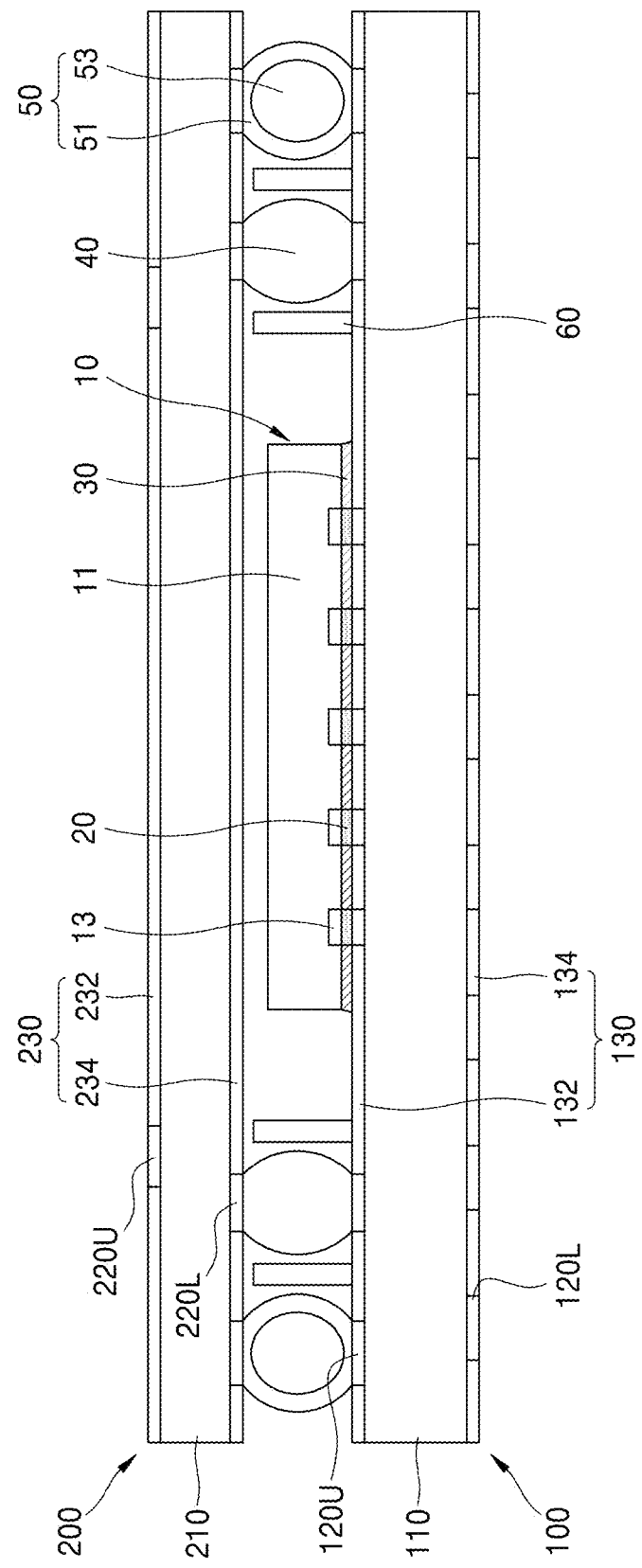

Referring to FIGS. 3D and 3E, the solder layer 51 of the plurality of core structures 50 may contact and be connected to the upper surface of the first package substrate 100, and the plurality of upper solder balls 40U and the plurality of lower solder balls 40L may be combined to form the plurality of solder balls 40. In an example embodiment, the solder layers 51 of some of the plurality of core structures 50 may contact and be connected to some other first upper surface pads 120U.

To connect the plurality of core structures 50 to the upper surface of the first package substrate 100, and form the plurality of solder balls 40, heat may be applied so that the solder layer 51 of the plurality of core structures 50, the plurality of upper solder balls 40U, and the plurality of lower solder balls 40L are melted, heat may be applied together while pressure is applied to the second package substrate 200, etc.

Figure 3F:
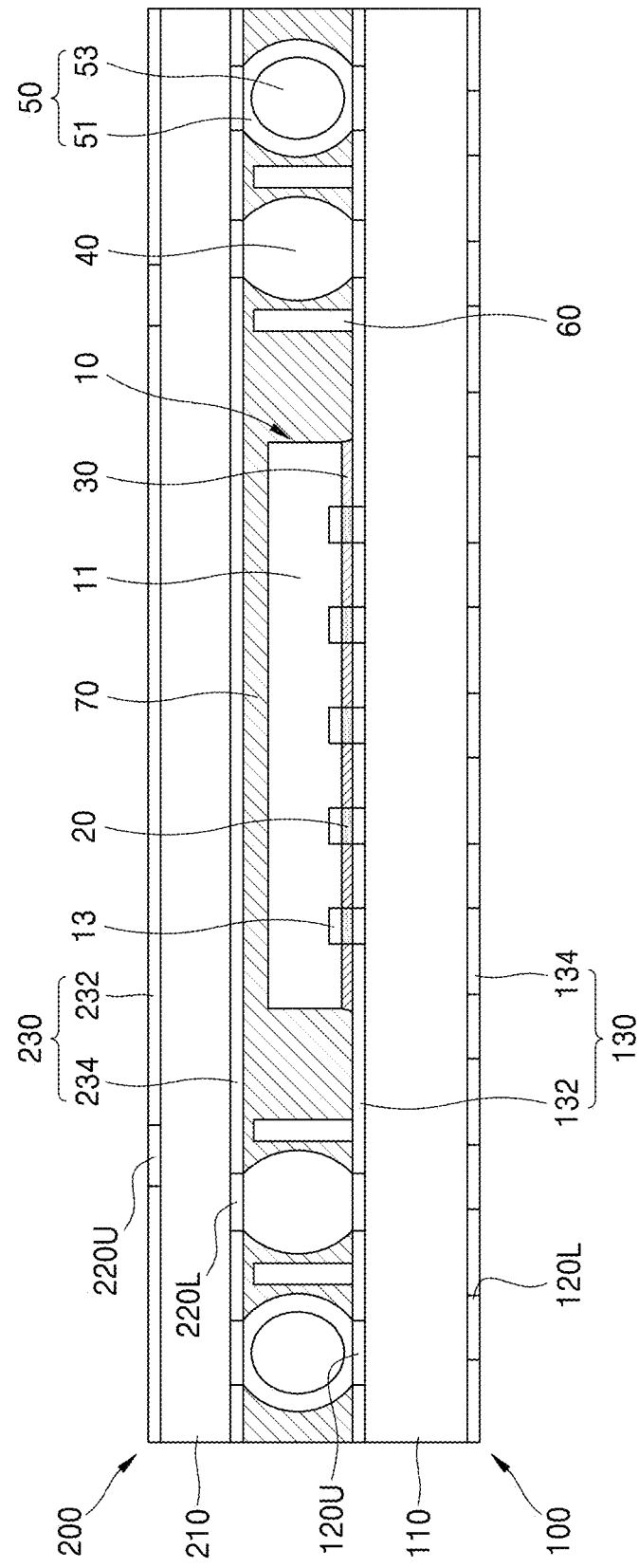

Referring to FIG. 3F, the molding layer 70 may fill between the first package substrate 100 and the second package substrate 200. The molding layer 70 may surround the semiconductor chip 10, the plurality of solder balls 40, the plurality of core structures 50, and the plurality of strip guides 60. The molding layer 70 may also fill between the upper surface of the semiconductor chip 10 and the lower surface of the second package substrate 200. In a process of forming the molding layer 70, pressure may be applied between the first package substrate 100 and the second package substrate 200.

Figure 3G:
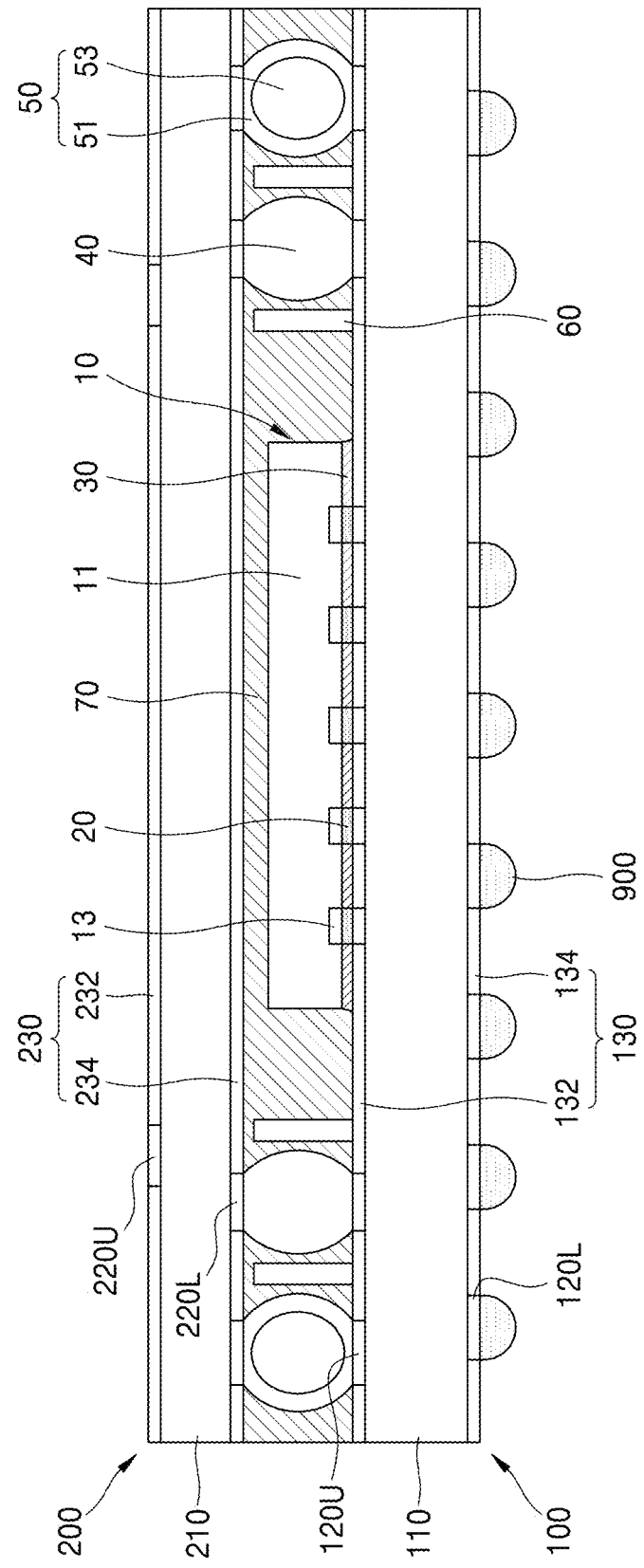

Referring to FIG. 3G, the plurality of external connection terminals 900 may be attached to at least some of the plurality of first lower surface pads 120L. In an example embodiment, the plurality of external connection terminals 900 may be attached, after the semiconductor chip 10 described with reference to FIG. 3A is attached.

Figure 4:
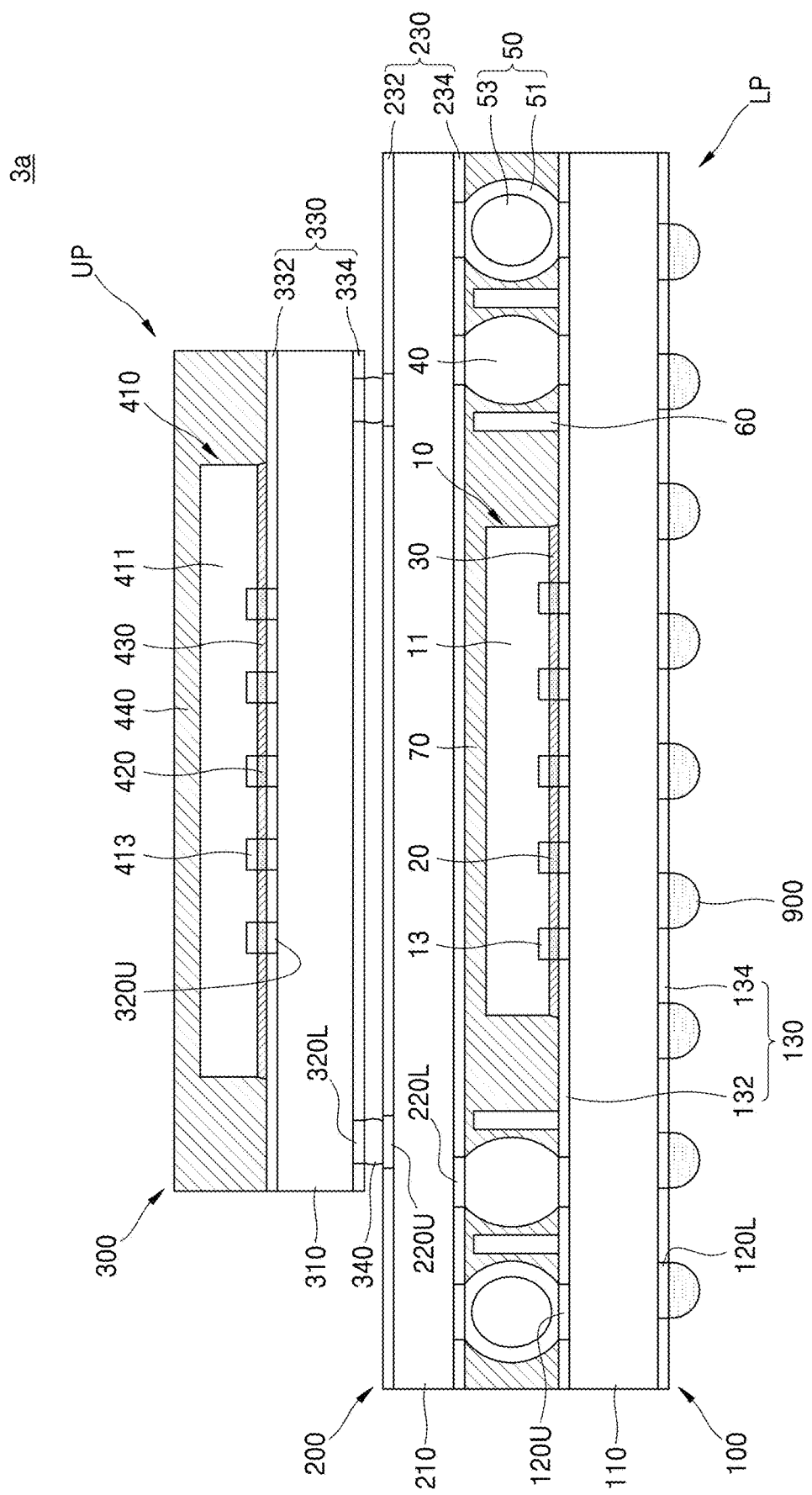
FIG. 4 is a cross-sectional view of a semiconductor package of a package on package (POP) type, according to an example embodiment.

FIG. 4 is a cross-sectional view of a semiconductor package 3a of a package on package type, according to an example embodiment.

Referring to FIG. 4, the semiconductor package 3a may include a semiconductor package of a package on package type, in which an upper package UP is attached on a lower package LP.

The lower package LP may include the semiconductor package 1a illustrated in FIG. 1A. The lower package LP may include the first package substrate 100, a first semiconductor chip 10 arranged on the first package substrate 100, and the second package substrate 200 arranged over the first package substrate 100 and the first semiconductor chip 10. The first semiconductor chip 10 may include a first semiconductor substrate 11 and a plurality of first chip pads 13 arranged on a first surface of the first semiconductor chip 10.

A first molding layer 70 may fill between the first package substrate 100 and the second package substrate 200, and surround the first semiconductor chip 10. A first underfill layer 30 may be arranged between the first semiconductor chip 10 and the first package substrate 100. The first underfill layer 30 may surround a plurality of first connection members 20. The plurality of core structures 50 penetrating the first molding layer 70, the plurality of solder balls 40, and the strip guide 60 penetrating at least a portion of the first molding layer 70 may be arranged between the first package substrate 100 and the second package substrate 200.

The upper package UP may include a third package substrate 300, a second semiconductor chip 410 arranged on the third package substrate 300, a second molding layer 440 surrounding the second semiconductor chip 410, and a plurality of package connection members 340 attached to a lower surface of the third package substrate 300. The plurality of package connection members 340 may be connected to the plurality of second upper surface pads 220U.

The third package substrate 300 may include a third substrate base 310, and third pads 320U and 320L. A third upper surface pad 320U may be arranged on the third package substrate 300 and a third lower surface pad 320L may be arranged under the third package substrate 300.

In an example embodiment, the third package substrate 300 may further include a third solder resist layer 330 covering an upper surface and a lower surface of the third substrate base 310. The third solder resist layer 330 may include a third upper surface solder resist layer 332, which exposes the plurality of third upper surface pads 320U and covers the upper surface of the third substrate base 310, and a third lower surface solder resist layer 334, which exposes the plurality of third lower surface pads 320L and covers the lower surface of the third substrate base 310.

The plurality of package connection members 340 may be attached to the plurality of third lower surface pads 320L. For example, the plurality of package connection members 340 may be arranged between the plurality of second upper surface pads 220U and the plurality of third lower surface pads 320L.

The second semiconductor chip 410 may include a second semiconductor substrate 411 including an active surface and an inactive surface, which are opposite to each other, and a plurality of second chip pads 413 arranged on the first surface of the second semiconductor chip 410. The second semiconductor chip 410 may be electrically connected to the third package substrate 300 via a plurality of second chip connection members 420 connecting the plurality of second chip pads 413 to the plurality of third upper surface pads 320U.

In an example embodiment, a second underfill layer 430 may be arranged between a first surface of the second semiconductor chip 410 and an upper surface of the third package substrate 300. The second underfill layer 430 may surround the plurality of second chip connection members 420. In an example embodiment, the second molding layer 440 may cover the upper surface of the third package substrate 300, and surround the second semiconductor chip 410 and the second underfill layer 430.

The semiconductor package 3a according to an example embodiment may include the plurality of core structures 50 arranged between the first package substrate 100 and the second package substrate 200, and accordingly, warpage of the semiconductor package 3a may be reduced or prevented and structural reliability of the semiconductor package 3a may be improved.

In addition, the strip guide 60 may be arranged between the first package substrate 100 and the second package substrate 200, and extend in parallel with the periphery of the first semiconductor chip 10, and accordingly, warpage of the semiconductor package 3a may be reduced or prevented and the structural reliability of the semiconductor package 3a may be improved.

In addition, the strip guide 60 may reduce or prevent the plurality of solder balls 40 and the plurality of core structures 50 from departing toward the semiconductor chip 10, and electrical connection reliability between the first semiconductor chip 10 and the first package substrate 100 may be improved.

It will be understood that when an element such as a layer, film, region, or substrate is referred to as being "on" another element, it may be directly on the other element or intervening elements may also be present. In contrast, when an element is referred to as being "directly on" another element, there are no intervening elements present. It will further be understood that when an element is referred to as being "on" another element, it may be above or beneath or adjacent (e.g., horizontally adjacent) to the other element.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

While the inventive concepts have been particularly shown and described with reference to example embodiments, it will be understood that various changes in form and details may be made therein without departing from the spirit and scope of the following claims.

What is claimed is:

1. A semiconductor package comprising:
   a first package substrate;
   a semiconductor chip on the first package substrate;
   a second package substrate over the first package substrate and the semiconductor chip;
   a plurality of core structures and a plurality of solder balls, the plurality of core structures and the plurality of solder balls between the first package substrate and the second package substrate, a first portion of the plurality of core structures and the plurality of solder balls being apart from the semiconductor chip in a first dimension direction, and a second portion of the plurality of core structures and the plurality of solder balls being apart from the semiconductor chip in a second dimension direction that is different than the first dimension direction; and a plurality of strip guides between the semiconductor chip and the plurality of core structures, the plurality of strip guides in parallel with a periphery of the semiconductor chip.

2. The semiconductor package of claim 1,
wherein each of the plurality of core structures comprises a core layer, and a solder layer surrounding the core layer.

3. The semiconductor package of claim 2,
wherein the core layer comprises copper, and the solder layer comprises a conductive solder.

4. The semiconductor package of claim 1,
wherein each of the plurality of core structures has a rugby ball shape in which a horizontal width of the core structure is greater than a vertical height of the core structure.

5. The semiconductor package of claim 1,
wherein the plurality of core structures are in rows between two opposite edges of the first package substrate and two opposite edges of the semiconductor chip corresponding to the two opposite edges of the first package substrate.

6. The semiconductor package of claim 1,
wherein the plurality of core structures are in rows between four edges of the first package substrate and four edges of the semiconductor chip corresponding to the four edges of the first package substrate.

7. The semiconductor package of claim 1,
wherein the plurality of core structures are symmetrical with respect to a central portion of the semiconductor chip in both the first dimension direction and the second dimension direction.

8. The semiconductor package of claim 1,
wherein a vertical height of each of the plurality of strip guides is in a range of 0.5 times to 1 time a vertical height of the plurality of core structures.

9. The semiconductor package of claim 8,
wherein a vertical height of some of the plurality of strip guides is different from a vertical height of others of the plurality of strip guides.

10. The semiconductor package of claim 1,
wherein a cross-section of the plurality of strip guides that is vertical to an extension direction of the plurality of strip guides has a rectangular shape in which a vertical height of the cross-section is greater than a horizontal width of the cross-section.

11. The semiconductor package of claim 1,
wherein the plurality of strip guides are symmetrical with respect to a central portion of the semiconductor chip in both the first dimension direction and the second dimension direction.

12. The semiconductor package of claim 1,
wherein the plurality of strip guides comprise a plurality of first sub-strip guides and a plurality of second sub-strip guides,
wherein the plurality of first sub-strip guides are between two opposite edges of the first package substrate and two opposite edges of the semiconductor chip corresponding to the two opposite edges of the first package substrate, and wherein the plurality of second sub-strip guides are between two other opposite edges of the first package substrate and two other opposite edges of the semiconductor chip.

13. The semiconductor package of claim 12,
wherein the plurality of first sub-strip guides extend in parallel with the two opposite edges of the first package substrate, and
the plurality of second sub-strip guides extend in parallel with the two other opposite edges of the first package substrate.

14. A semiconductor package comprising:
a lower package comprising:
a first package substrate;
a first semiconductor chip on the first package substrate;
a second package substrate over the first package substrate and the first semiconductor chip;
a plurality of core structures and a plurality of solder balls, the plurality of core structures and the plurality of solder balls between the first package substrate and the second package substrate, a first portion of the plurality of core structures and the plurality of solder balls being apart from the first semiconductor chip in a first dimension direction, and a second portion of the plurality of core structures and the plurality of solder balls being apart from the first semiconductor chip in a second dimension direction that is different than the first dimension direction; and
a plurality of strip guides between the first semiconductor chip and the plurality of solder balls, the plurality of strip guides between the first semiconductor chip and the plurality of core structures; and
an upper package comprising,
a third package substrate;
a second semiconductor chip on the third package substrate; and
a package connection member between the lower package and the upper package, and the package connection member electrically connects the lower package to the upper package.

15. The semiconductor package of claim 14,
wherein a space width between each of the plurality of strip guides is in a range from 220 µm to 300 µm.

16. The semiconductor package of claim 14
wherein a horizontal width of each of the plurality of strip guides is in a range from 20 µm to 40 µm.

17. The semiconductor package of claim 14,
wherein a cross-section of the plurality of strip guides, which is vertical to an extension direction of the plurality of strip guides, has a convex upper surface.

18. The semiconductor package of claim 14,
wherein the plurality of core structures and the plurality of strip guides are symmetrical with respect to a central portion of the first semiconductor chip in both the first dimension direction and the second dimension direction.

19. A semiconductor package comprising:
a first package substrate;
a semiconductor chip on the first package substrate;
a second package substrate over the first package substrate and the semiconductor chip;
a molding layer between the first package substrate and the second package substrate, and surrounding the semiconductor chip;

a plurality of core structures penetrating the molding layer, a first portion of the plurality of core structures being apart from the semiconductor chip in a first dimension direction, a second portion of the plurality of core structures being apart from the semiconductor chip in a second dimension direction that is different from the first dimension direction, and the plurality of core structures in symmetrical rows with respect to a central portion of the semiconductor chip;

a plurality of solder balls penetrating the molding layer, and connect the first package substrate to the second package substrate; and a plurality of strip guides comprising a plurality of first sub-strip guides and a plurality of second sub-strip guides, wherein the plurality of first sub-strip guides are between two opposite edges of the first package substrate and two opposite edges of the semiconductor chip corresponding to the two opposite edges of the first package substrate, and in parallel with the two opposite edges of the first package substrate, and a cross-section of the plurality of first sub-strip guides, which is vertical to an extension direction of the plurality of first sub-strip guides, has a rectangular shape in which a vertical height of the cross-section of the plurality of first sub-strip guides is greater than a horizontal width of the cross-section of the plurality of first sub-strip guides, and wherein the plurality of second sub-strip guides are arranged between two other opposite edges of the first package substrate and two other opposite edges of the semiconductor chip, and in parallel with the two other opposite edges of the first package substrate, and a cross-section of the plurality of second sub-strip guides, which is vertical to an extension direction of the plurality of second sub-strip guides, has a rectangular shape in which a vertical height of the cross-section of the plurality of second sub-strip guides is greater than a horizontal width of the cross-section of the plurality of second sub-strip guides.

20. The semiconductor package of claim 19,
wherein the plurality of strip guides comprise copper.

* * * * *